(12) United States Patent
Goswami

(10) Patent No.: US 8,964,881 B2
(45) Date of Patent: Feb. 24, 2015

(54) METHOD AND APPARATUS FOR HIGH EFFICIENCY, HIGH DYNAMIC RANGE DIGITAL RF POWER AMPLIFICATION

(75) Inventor: Sushmit Goswami, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 169 days.

(21) Appl. No.: 13/587,209

(22) Filed: Aug. 16, 2012

(65) Prior Publication Data

US 2014/0049318 A1    Feb. 20, 2014

(51) Int. Cl.
 H04L 27/00        (2006.01)
(52) U.S. Cl.
 USPC ......... 375/295; 375/297; 455/114.3; 455/522
(58) Field of Classification Search
 CPC ... H04L 1/0003; H04L 1/0071; H04L 27/368; H03F 1/3247; H04B 1/0475; H04B 1/0483
 USPC .................. 375/295, 297; 455/114.3, 522
 See application file for complete search history.

(56) References Cited

U.S. PATENT DOCUMENTS

| 7,724,839 | B2 | 5/2010 | Chen et al. | |
|---|---|---|---|---|
| 7,948,312 | B2 | 5/2011 | Cao | |
| 8,026,763 | B2 | 9/2011 | Dawson et al. | |
| 2005/0018787 | A1* | 1/2005 | Saed ............................ | 375/296 |
| 2008/0075194 | A1 | 3/2008 | Ravi et al. | |
| 2010/0117727 | A1 | 5/2010 | Dawson et al. | |
| 2011/0075780 | A1* | 3/2011 | Petrovic ........................ | 375/355 |
| 2011/0148518 | A1 | 6/2011 | Lejon et al. | |
| 2012/0057655 | A1* | 3/2012 | Marsili et al. ................. | 375/300 |
| 2012/0269293 | A1* | 10/2012 | Peng et al. .................... | 375/297 |

OTHER PUBLICATIONS

Chung, et al.; "Asymmetric Multilevel Outphasing Architecture for Multi-standard Transmitters;" IEEE Radio Frequency Integrated Circuits Symposium, 2009; pp. 237-240.
Presti, et al.; "A 25 dBm Digitally Modulated CMOS Power Amplifier for WCDMA/EDGE/OFDM With Adaptive Digital Predistortion and Efficient Power Control;" IEEE Journal of Solid-State Circuits; vol. 44, No. 7; Jul. 2009; pp. 1883-1896.
Sadeghifar, et al.; "A Survey of RF DACs;" in Swedish Systems on Chip Conference SSOCC; 2010; 5 pages.
Yoo, et al.; "A Switched-Capacitor RF Power Amplifier," IEEE Journal of Solid-State Circuits; vol. 46, No. 12; Dec. 2011; pp. 2977-2987.
PCT Search Report and Written Opinion of the ISA for PCT/US2012/053833 dated Apr. 4, 2012.

* cited by examiner

Primary Examiner — Ted Wang
(74) Attorney, Agent, or Firm — Daly, Crowley, Mofford & Durkee, LLP

(57) ABSTRACT

A digital, radio frequency (RF) power amplifier includes first and second RF digital to analog converters (RF DACs) and a combiner to combine output signals of the first and second RF DACs. In at least one embodiment, the digital RF power amplifier may be operated in any of a number of different operating modes by appropriately generating amplitude and phase input signals for the first and second RF DACs. A mode of operation may be selected for the digital RF power amplifier based, at least in part, on a desired average output power level of the power amplifier.

26 Claims, 8 Drawing Sheets

METHOD AND APPARATUS FOR HIGH EFFICIENCY, HIGH DYNAMIC RANGE DIGITAL RF POWER AMPLIFICATION

FIELD

Subject matter described herein relates to radio frequency (RF) circuits and techniques and, more particularly, to digital RF power amplification circuits and techniques.

BACKGROUND

Many modern wireless communication standards require high dynamic range. For example, many of these standards use modulation and coding schemes that involve some form of envelope or amplitude modulation that requires accurate amplitude values at both higher and lower levels. Energy efficiency is another attribute that is highly desirable in communication systems and networks, particularly those that use portable battery powered devices. However, radio frequency (RF) power amplification typically involves a tradeoff between power efficiency and dynamic range. That is, some power amplification strategies may offer higher dynamic range with less efficiency, while others may provide enhanced efficiency with less dynamic range. Thus, there is a need for RF power amplification architectures and techniques that are capable of achieving both power efficiency and high dynamic range.

SUMMARY

A digital, radio frequency (RF) power amplifier architecture is disclosed that is capable of achieving both high power efficiency and high dynamic range. The digital RF power amplifier architecture is capable of operation in multiple different operating modes that each offer a different level of efficiency. These operating modes may include, for example, a polar mode, a linear amplification with non-linear components (LINC) mode, a multi-level LINC mode, an asymmetric multilevel outphasing (AMO) mode, and/or others. In some implementations, the digital RF power amplifier architecture may switch between the different modes based upon an average output power level that the amplifier is currently called upon to generate. Thus, when high average power levels are required, the amplifier can use an operating mode that is highly efficient. When lower average power levels are required, and efficiency is less of a concern, the power amplifier can use a less efficient operating mode that provides better linearity. By switching between the various operating modes, the power amplifier architecture is, overall, able to achieve high dynamic range and high efficiency.

In one aspect of the concepts, systems, circuits, and techniques described herein, a digital RF power amplifier is provided that uses radio frequency digital to analog converters (RF DACs) to provide an amplification function. In one possible approach, for example, first and second RF DACs may be provided that each have a plurality of input terminals to receive signals (e.g., digital data words) representative of amplitude levels to be generated. The RF DACs may then use these digital data words to generate output signals having the corresponding amplitudes. A combiner may then be used to combine the output signals of the first and second RF DACs. The first and second RF DACs may also be clocked by corresponding clock circuits each having a controllable phase. By appropriately controlling the phase and amplitude of the two RF DACs, a number of different power amplifier operating modes may be emulated. As described above, in some implementations, the power amplifier may switch between these modes based on a current average power level to be generated or some other criterion. A processor may be provided to generate a first amplitude control word, a second amplitude control word, a first phase value, and a second phase value for the first and second RF DACs.

In another aspect of the concepts, systems, circuits, and techniques described herein, a method for use with a digital power amplifier having first and second radio frequency digital to analog converters (RF DACs) and a combiner to combine output signals of the first and second RF DACs is provided. The first and second RF DACs may each include a plurality of inputs to receive a digital data word representative of an amplitude and a corresponding clock circuit having an adjustable phase. The method may include selecting an amplification mode to be used in the digital power amplifier based, at least in part, on an average output power level to be generated by the digital power amplifier. In addition, the method may include generating amplitude input signals and phase input signals for the first and second RF DACs based, at least in part, on the selected amplification mode. The digital power amplifier may be capable of multiple different amplification modes including at least a polar mode. Other possible modes may include, for example, a linear amplification with non-linear components (LINC) mode, a multi-level LINC mode, an asymmetric multilevel outphasing (AMO) mode, and/or others.

In a further aspect of the concepts, systems, circuits, and techniques described herein, a computer readable medium is provided having instructions stored thereon that, when executed by a computer, perform a method for use with a digital power amplifier having first and second radio frequency digital to analog converters (RF DACs) and a combiner to combine output signals of the first and second RF DACs. More specifically, the method comprises: selecting an amplification mode to be used in the digital power amplifier based, at least in part, on an average output power level to be generated; and generating data word input signals and phase input signals for the first and second RF DACs based, at least in part, on the selected amplification mode; wherein the digital power amplifier is capable of multiple different amplification modes including a polar mode.

BRIEF DESCRIPTION OF THE DRAWINGS

The foregoing features may be more fully understood from the following description of the drawings in which.

DETAILED DESCRIPTION

As will be described in greater detail, in one aspect described herein, a power amplifier architecture is provided that is capable of operating in multiple different power amplification modes. In addition, in some implementations, this architecture may be switched between different modes during normal amplifier operation in a manner that enhances the overall dynamic range and efficiency of the amplifier. The power amplifier may make use of multiple radio frequency (RF) digital to analog converters (DACs) that are each coupled at an output to a combiner circuit. The different power amplification modes can be achieved by appropriately selecting inputs to the RF DACs.

Figure 1:
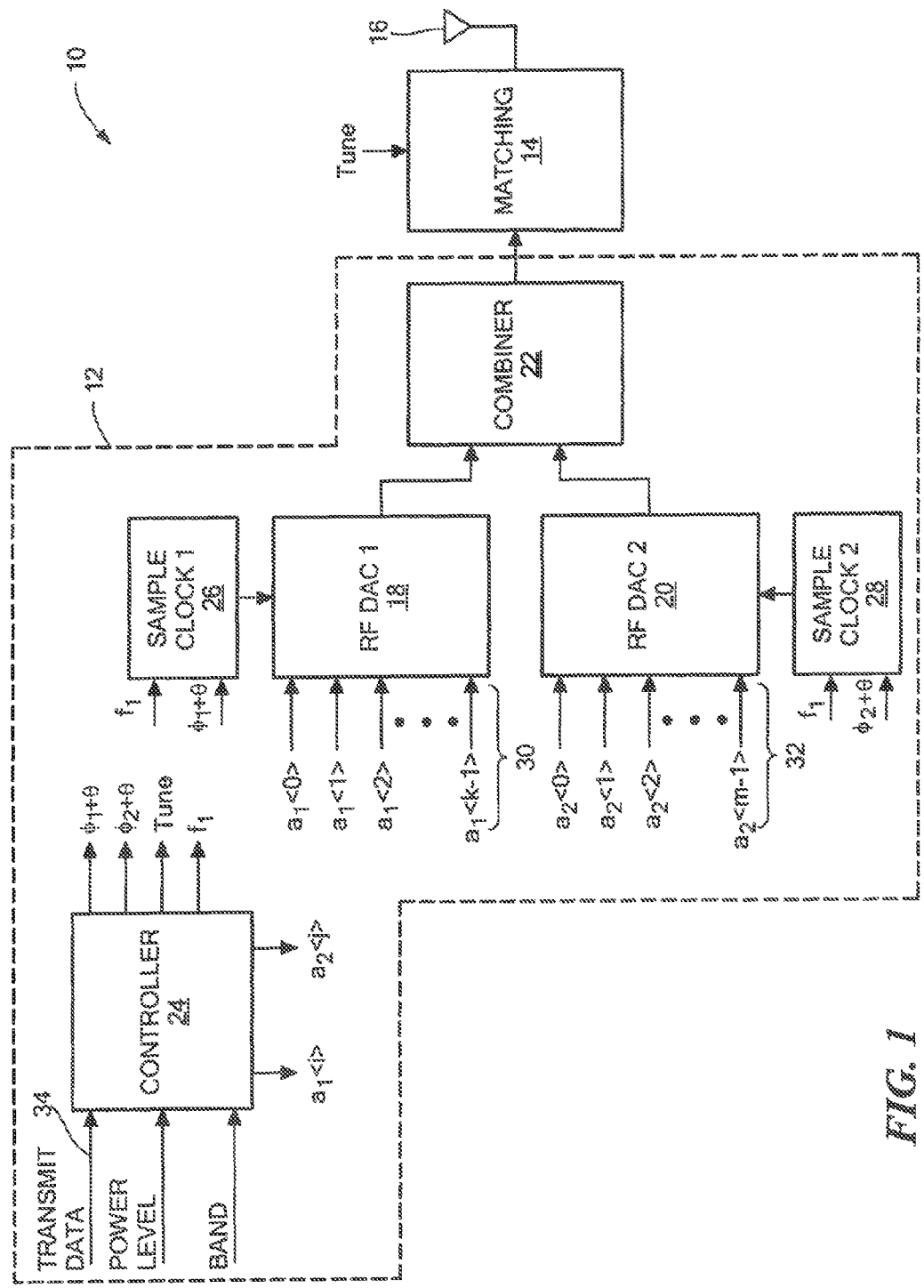
FIG. 1 is a schematic diagram illustrating an exemplary digital radio frequency (RF) transmitter in accordance with an implementation.

FIG. 1 is a block diagram illustrating an exemplary digital radio frequency (RF) transmitter 10 in accordance with an implementation. As shown, digital RF transmitter 10 may include a digital RF power amplifier 12 and a matching network 14. The digital RF power amplifier 12 may generate amplified, modulated RF signals to be transmitted into a wireless channel via an antenna 16. Matching network 14 may provide an impedance match between power amplifier 12 and antenna 16 within a band of interest.

As illustrated in FIG. 1, RF power amplifier 12 may include: a first RF digital to analog converter (RF DAC) 18, a second RF DAC 20, a combiner 22, a controller 24, and first and second sampling clocks 26, 28. As is well known in the art, an RF DAC is a circuit or device that is capable of converting a digital input signal to an analog output signal at RF speeds. Any type of RF DACs may be used for first and second RF DACs 18, 20 in different embodiments including, for example, voltage mode RF DACs, current mode RF DACs, switched capacitor RF DACs, mixer DACs, RF DACs using sigma-delta modulators, and/or others. As illustrated, first and second RF DACs 18, 20 may each have a plurality of input ports 30, 32 to receive corresponding digital control words $a_1$, $a_2$ from controller 24. First and second RF DACs 18, 20 may be of the same size (i.e., same number of inputs) or a different size (i.e., different number of inputs). The digital control words may set, for example, an amplitude of an output signal of each RF DAC 18, 20. After first and second RF DACs 18, 20 receive the digital control words $a_1$, $a_2$ from controller 24, they may each generate an analog output signal based thereon. The analog output signals of first and second RF DACs 18, 20 are then combined in combiner 22.

First and second sampling clocks 26, 28 are operative for generating clock signals for first and second RF DACs 18, 20, respectively. First and second sampling clocks 26, 28 set up the timing at which first and second RF DACs 18, 20 convert a digital data word on the input ports to an analog signal at an output. In a typical embodiment, the clock signals generated by first and second sampling docks 26, 28 will be at RF frequencies. As illustrated, the first and second sampling clocks 26, 28 may each have an input port to receive a phase value (i.e., $\phi_1(t)+\theta(t)$ and $\phi_2(t)+\theta(t)$, respectively) from controller 24. These phase values may be used to adjust the phases of the sampling clocks 26, 28. The phase adjustments may modify, for example, the timing of the rising and/or falling edges of the clock pulses generated by the sampling clocks 26, 28.

Typically, controller 24 will deliver a stream of digital control words to each of first and second RF DACs 18, 20. First and second RF DACs 18, 20 may then sample these control words, using clock signals generated by sampling clocks 26, 28, to generate corresponding analog amplitudes at outputs thereof. If the sampling occurs at RF frequencies, the output signals generated by first and second RF DACs 18, 20 will be RF signals. Controller 24 may also deliver a stream of digital phase signals to first and second sampling clocks 26, 28. These digital phase signals may modulate the phases of the clock signals generated by first and second sampling clocks 26, 28. These modulated phases will, in turn, modulate the phases of the RF output signals generated by first and second RF DACs 18, 20. The RF output signals of the first and second RF DACs 18, 20 are then combined in combiner 22 after which they are delivered to antenna 16, through matching network 14, for transmission into the wireless channel. As will be appreciated, the modulation of the amplitudes and the phases of the RF output signals of the first and second RF DACs 18, 20 will affect the way the signals combine in combiner 22.

Controller 24 may generate digital control words for first and second RF DACs 18, 20 and digital phase signals for first and second sampling clocks 26, 28 based, at least in part, on data to be transmitted into a wireless channel (i.e., transmit data). Controller 24 may receive the transmit data from another controller (e.g., at an input 34) or it may generate the transmit data internally. Thus, the stream of control words delivered to first and second RF DACs 18, 20 and the stream of digital phase signals delivered to first and second sampling clocks 26, 28 may result in the transmission of a modulated RF signal into the wireless channel that is representative of transmit data to be delivered to a remote wireless entity. Any of a variety of different modulation schemes may be used for the transmit signals.

In some implementations, RF power amplifier 12 may be configured for operation in multiple different power amplification operating modes. These modes may include, for example, a polar mode, a linear amplification with non-linear components (LINC) mode, a multi-level LINC mode, an asymmetric multilevel outphasing (AMO) mode, and/or others. In addition, in some implementations, one or more criteria may be used to determine which of the power amplification modes to use at a particular point in time. Controller 24 may be configured to determine which mode power amplifier 12 is to use at a particular time. The selected mode may then be implemented by appropriately generating digital control words and phase values for first and second RF DACs 18, 20 and first and second sampling clocks 26, 28.

In one approach, controller 24 may determine which power amplification mode to use at a particular time based on, for example, a desired average power level to be transmitted. For example, in one implementation, if a high average power level is desired, a polar mode may be used in the RF power amplifier 12. The polar mode is typically the most efficient of the modes. If an intermediate power level is desired, an AMO or multi-level LINC mode may be used. If a low power level is desired, a pure LINC mode may be used. LINC mode is typically the least efficient and most linear of the modes. However, at low average power levels, efficiency may be less of a concern. It should be appreciated that any combination of different power amplifier operating modes may be used in a power amplifier in various embodiments.

In some implementations, different power ranges may be specified within which each of the different power amplification modes are used. Once the power ranges are established, switching between the modes may be automatic. For example, as illustrated in FIG. 1, controller 24 may receive a control signal from another controller or processor (or generate one internally) indicating an average power level to be transmitted. Controller 24 may then select a power amplification mode to use based on a range within which the average power level falls. If the average power level later changes, controller 24 may change the power amplification mode accordingly. Once a mode has been selected, controller 24 may generate control signals for first and second RF DACs 18, 20 and first and second sampling clocks 26, 28 based, at least in part, on the selected mode. As will be appreciated, other techniques for selecting a power amplification mode may alternatively be used.

In other embodiments, other criteria may be used by controller 24 to determine which power amplification mode to use at a particular point in time. For example, in battery powered applications, a mode may be selected based on a level of charge remaining in a battery. That is, a more efficient mode may be selected when battery charge is low and a less efficient, more linear mode may be selected when a battery is fully charged. Typically, the battery voltage in a mobile handset will vary as the battery discharges. For example, a lithium ion battery may vary from approximately 5.5V at full charge to approximately 2.7 V when the battery is depleted. In one possible approach, efficient transmitter operation may be maintained by using a larger control word at lower battery levels. The power level may be proportional to ($V_{batt}$×output amplitude)$^2$, so lower battery voltage can be compensated for by using a higher output amplitude value. Other mode switching criteria may also be used, including combinations of different criteria (e.g., average output power level and battery energy level, etc.).

In some implementations, RF power amplifier 12 may be used as a multi-mode power amplifier that does not change between modes automatically. For example, RF power amplifier 12 may be configured to allow a user to manually set an amplification mode to use. Thus, an end user that is primarily concerned with efficient operation for a particular application may configure the amplifier 12 to only use an efficient mode, and so on. In some implementations, RF power amplifier 12 may have both "static" and "dynamic" power control options. A user could select the static power control option when a single operating mode is desired and the dynamic power control option when a dynamically varying operating mode is desired. In one possible approach, the static option may be used when only lower "average" power levels are to be transmitted. Thus, some part of the RF DAC's (e.g., portions corresponding to smaller amplitudes) may be turned off during static operation, independent of the RF signal. The dynamic power control option may be used to achieve high-speed waveform-dependent adjustment.

Controller 24 may be implemented using any type of digital processing device capable of calculating or otherwise determining digital control words and/or phase values for use by first and second RF DACs 18, 20 and first and second sampling clocks 26, 28. This may include, for example, a digital signal processor (DSP), a general purpose microprocessor, an application specific integrated circuit (ASIC), a reduced instruction set computer (RISC), a field programmable gate array (FPGA), a controller, a microcontroller, logic circuitry, and/or others, including combinations of the above. First and second RF DACs 18, 20 may include any type of high speed DAC. In at least one implementation, high speed DACs are used that include a plurality of capacitors that are coupled to a common output node.

Combiner 22 may include any type of radio frequency (RF) combiner. The type of combiner used may depend, for example, on the type of RF DACs that are used (e.g., current mode versus voltage mode, etc.). In various embodiments, combiner 22 may include, for example, a transformer-based combiner, a hybrid combiner (0 degree, 90 degree, 180 degree, etc.), a Wilkinson combiner, a lumped quarter wave combiner, and/or others. Combiner 22 can be an in-phase combiner or an out-of-phase combiner. The type of combiner used may dictate how the phase values are calculated for the first and second RF DACs 18, 20.

Matching network 14 may include any type of circuit or structure for matching the output impedance of a circuit to the impedance of an antenna (or other load device). In some implementations, matching network 14 may be tunable. That is, matching network 14 may be tuned during transmitter operation for use in different transmission bands. As shown in FIG. 1, matching network 14 may have an input to receive a tuning control signal from controller 24 to tune the matching network 14 for a particular operational band. In some implementations, matching network 14 may be implemented as part of combiner 22.

Referring back to FIG. 1, first and second RF DACs 18, 20 may each include a plurality of input ports to receive corresponding digital control words from controller 24. That is, first RF DAC 18 may include input ports 30 to receive digital control word $a_1$ and second RF DAC 20 may include input ports 32 to receive digital control word $a_2$. The digital control words $a_1$, $a_2$ are each representative of an amplitude to be generated by a corresponding RF DAC 18, 20. In addition, as described above, first and second sampling clocks 26, 28 may each include an input to receive a corresponding phase value $\phi_1(t)+\theta(t)$, $\phi_2(t)+\theta(t)$ from controller 24. The phase value will adjust the phase of the corresponding clock signal.

As described above, in various implementations, digital power amplifier 12 of FIG. 1 is capable of achieving multiple different modes of operation. These modes may include, for example, a polar mode, a linear amplification with non-linear components (LINC) mode, a multi-level LINC mode, an asymmetric multilevel outphasing (AMO) mode, and/or others. A brief description of each of these modes and of the techniques used to achieve the different modes using the control words and control phases follows.

In general, any radio frequency (RF) signal can be represented as:

$$V_{RF}(t)=A(t)\times\sin(2\pi ft+\theta(t))$$

where A(t) is the time dependent amplitude information, f is the carrier frequency, and θ(t) is the time dependent phase information. As is well known, such a signal may be used to represent digital data. As described previously, controller 24 of FIG. 1 may receive transmit data at an input 34 that is to be transmitted into a wireless channel via antenna 16. Controller 24 may then use the transmit data to generate control signals for first and second RF DACs 18, 20 and first and second sample clocks 26, 28 that will generate the above signal (or a good approximation of the signal) at the output of combiner 22. Thus, the goal is to reconstruct amplitude A(t) at the output of combiner 22. The desired phase information will typically pass through amplifier 12 unaltered. The amplitude at the output of RF DAC 18 may be represented as:

$$V_1(t)=a_1<0>+2\times a_1<1>+\ldots+2^{k-1}\times a_1<k-1>$$

and the amplitude at the output of RF DAC 20 may be represented as:

$$V_2(t) = a_2{<}0{>} + 2 \times a_2{<}1{>} + \ldots + 2^{m-1} \times a_2{<}m-1{>}$$

where $a_1{<}i{>}$ and $a_2{<}j{>}$ are the individual bits of digital control words $a_1$ and $a_2$, respectively. The digital control words $a_1$, $a_2$ may be clocked into the first and second RF DACs 18, 20 at a specific clock frequency.

To simplify description, it will be assumed in the discussion that follows that the maximum values of $V_1$ and $V_2$ are normalized to 0.5 and the maximum value of A(t) is normalized to 1. In some modes, $V_1$ may have a non-zero outphasing angle $\phi_1(t)$ and $V_2$ may have a non-zero outphasing angle $\phi_2(t)$. This may be achieved by adjusting the phase of sample clock 26 of RF DAC 18 to $\phi_1(t)+\theta(t)$ and the phase of sample clock 28 of RF DAC 20 to $\phi_2(t)+\theta(t)$, where $\theta(t)$ represents the desired output phase. As described above, the desired phase $\theta(t)$ will pass through amplifier 12 unaltered. As such, it will be dropped in the discussion that follows. In addition, time subscripts (t) will be dropped to simplify notation. The RF signal amplitude at the output of combiner 22 can thus be represented as:

$$A(t) = V_1 \times \cos(\phi_1) + V_2 \times \cos(\phi_2)$$

for all of the different modes of digital power amplifier 12.

Based on the above, there will typically be four degrees of freedom available to reconstruct the amplitude information at the output of amplifier 12: $V_1$, $V_2$, $\phi_1$, and $\phi_2$. The difference between the various modes of operation of digital power amplifier 12 is how these four degrees of freedom are used. In general, to achieve higher efficiency, $V_1$ and $V_2$ may be primarily used to achieve a desired A(t). This is because losses in the power amplifier will be proportional to $V_1$ and $V_2$. However, in some applications, use of $V_1$ and $V_2$ alone may not allow adequate resolution to be achieved. In one possible strategy, the smallest $V_1$ and $V_2$ that can achieve the desired results may always be used. Also, it may be desirable to always minimize the use of outphasing (i.e., only use outphasing if it is required).

In light of the above, to implement polar mode, the four degrees of freedom may be set as follows:

$$V_1 = V_2$$

$$\phi_1 = 0$$

$$\phi_2 = 0$$

Figure 2:
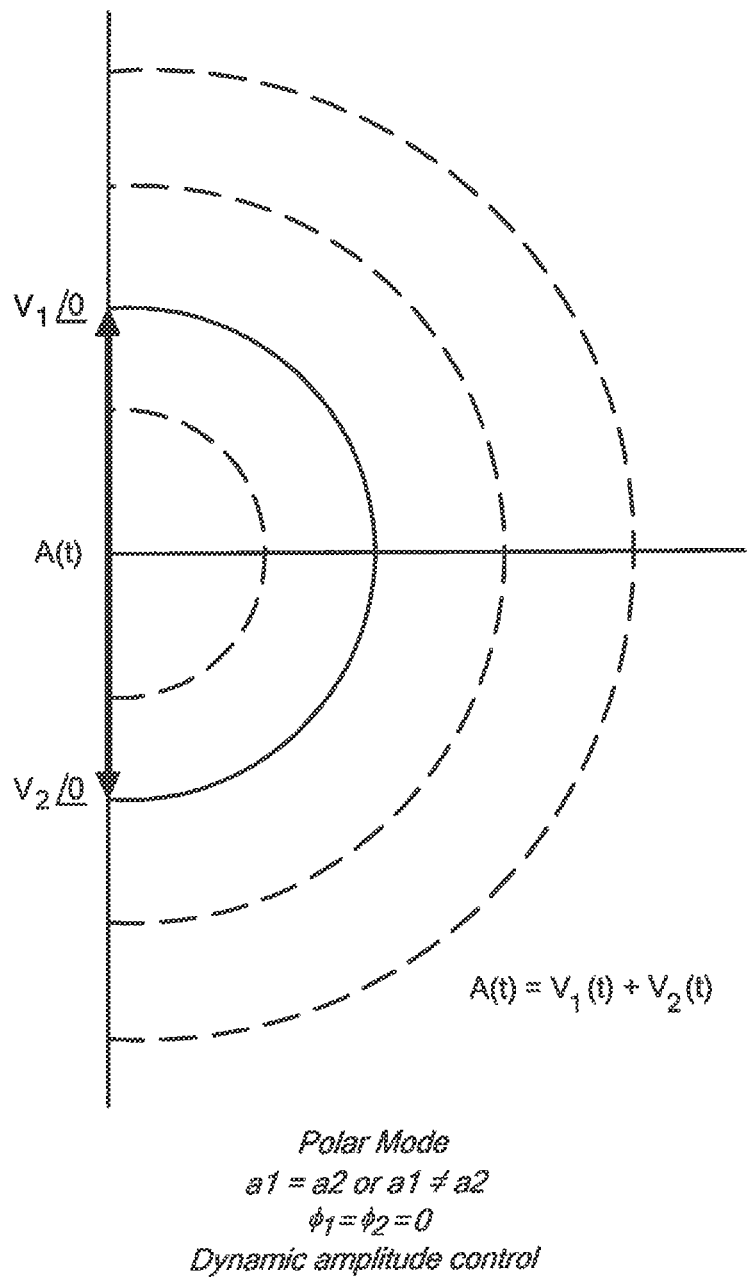
FIG. 2 is a plot illustrating exemplary amplitude control signals and phase control signals for use during a polar mode of operation in a digital power amplifier in accordance with an implementation.

As shown, both outphasing phases are equal to zero, indicating that outphasing is not being used. The output amplitude A(t) will be the sum of $V_1(t)$ and $V_2(t)$. As described previously, this is the most power efficient mode. The above-described scenario is an example of symmetric polar mode, where $V_1 = V_2$ (and $a_1 = a_2$). It should be appreciated that asymmetric polar mode may also be used where $V_1 \neq V_2$ (and $a_1 \neq a_2$). FIG. 2 is a plot illustrating exemplary amplitude and phase components that may be used during a symmetric polar mode of operation in a digital power amplifier in accordance with an embodiment. The solid semi-circular line in FIG. 2 represents the selected RF DAC amplitude setting at time t. This amplitude setting will change with time. The dashed semi-circular lines represent other possible DAC amplitude settings (of which there will be $2^k$ possibilities for a DAC having k inputs). FIG. 2 assumes a difference combiner is being used.

To implement multi-level LINC, the four degrees of freedom may be set as follows:

$$V_1 = V_2$$

$$\phi_1 = \phi_2$$

This mode may be used when polar mode by itself is insufficient. The output amplitude A(t) will be equal to $V_1(t) \times \cos(\phi_1(t)) + V_2(t) \times \cos(\phi_2(t))$. Multi-level LINC is symmetric. In one strategy, the smallest $V_1 = V_2$ may be selected that is still greater than 0.5 A. This voltage will be denoted VOPT. This voltage value may be used to determine the bit settings of digital control words $a_1$ and $a_2$. The outphasing angles may be calculated as $\phi_1 = \phi_2 = a\cos(0.5 \times A/VOPT)$, where a cos is the inverse cosine operator. An exemplary implementation of ML-LINC is described in U.S. Pat. No. 7,724,839 to Chen et al., which is hereby incorporated by reference in its entirety.

As with multi-level LINC, to implement outphasing (or pure LINC), the four degrees of freedom may be set as:

$$V_1 = V_2$$

$$\phi_1 = \phi_2$$

Figure 3:
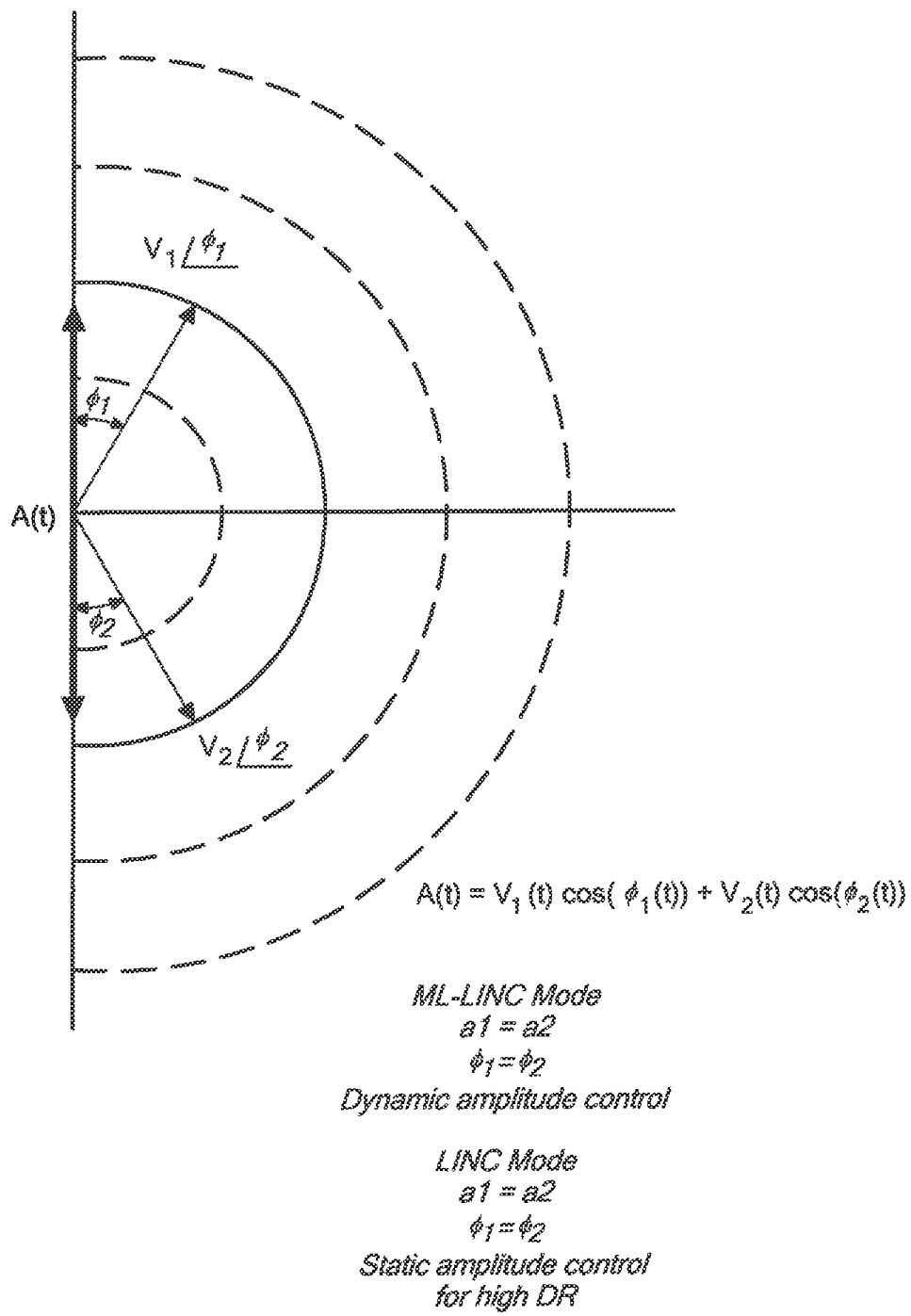
FIG. 3 is a plot illustrating exemplary amplitude control signals and phase control signals for use during a LINC mode of operation and an ML-LINK mode of operation in a digital power amplifier in accordance with an implementation.

However, in this mode, only outphasing is used with no polar component. As before, the output amplitude A(t) will be equal to $V_1(t) \times \cos(\phi_1(t)) + V_2(t) \times \cos(\phi_2(t))$. This is symmetric outphasing. The outphasing angles may be calculated as $\phi_1 = \phi_2 = a\cos(A(t))$, where a(t) is normalized to 1. FIG. 3 is a plot illustrating exemplary amplitude and phase settings that may be used during LINC mode or ML-LINK mode in a digital power amplifier in accordance with an embodiment. As in FIG. 2, the solid semi-circular line in FIG. 3 represents the selected RF DAC amplitude setting at time t. The dashed semi-circular lines represent other possible DAC amplitude settings.

To implement AMO, the four degrees of freedom may be also be set as:

$V_1$ $V_2$ $\phi_1$ $\phi_2$

That is, $V_1$ can be different from $V_2$ and $\phi_1$ can be different from $\phi_2$. This mode may be used, for example, when polar mode by itself is not sufficient. In this case, the smallest $V_1 + V_2$ combination may be selected that is still greater than A. In one approach, $V_1$ and $V_2$ may be adjacent DAC settings. For example, in one scenario, if $V_1$ is 111, then $V_2$ might be 110 (i.e., only 1 DAC step lower). $V_1$ and $V_2$ may also be related as follows:

$$V_1 \times \sin(\phi_1) = V_2 \times \sin(\phi_2)$$

In addition, as described above:

$$A(t) = V_1 \times \cos(\phi_1) + V_2 \times \cos(\phi_2)$$

Figure 4:
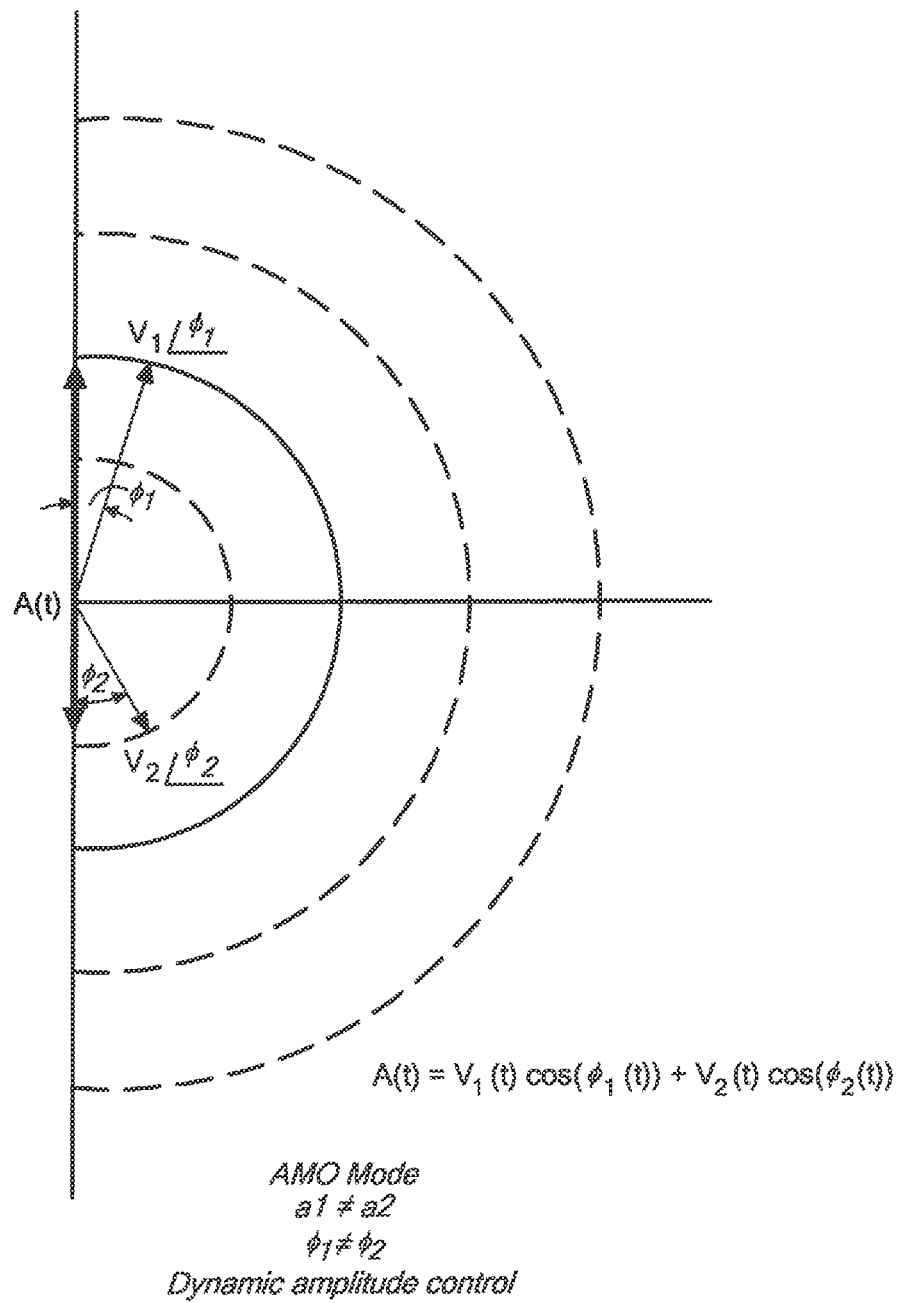
FIG. 4 is a plot illustrating exemplary amplitude control signals and phase control signals for use during an AMO mode of operation in a digital power amplifier in accordance with an implementation.

These two equations represent two equations with two unknowns and can thus be solved in a strait forward manner within a controller. FIG. 4 is a plot illustrating amplitude and phase settings that may be used when implementing AMO mode in a digital power amplifier in accordance with an embodiment. An exemplary implementation of AMO is described in U.S. Pat. No. 8,026,763 to Dawson et al., which is hereby incorporated by reference in its entirety.

Figure 5:
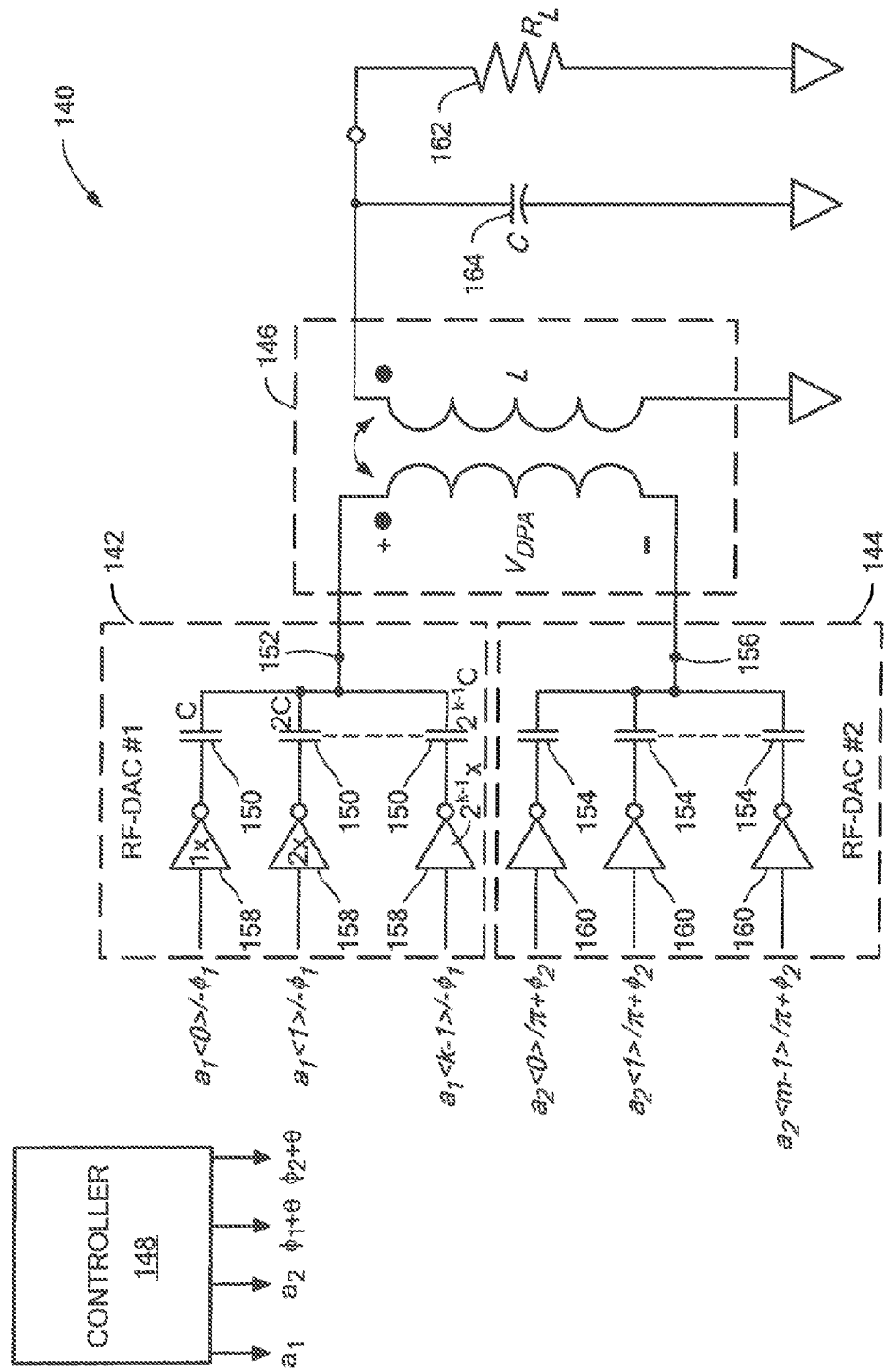
FIG. 5 is a schematic diagram illustrating an exemplary digital RF power amplifier in accordance with an implementation.

FIG. 5 is a schematic diagram illustrating a digital power amplifier 140 in accordance with an implementation. Digital power amplifier 140 may be used within, for example, digital RF transmitter 10 of FIG. 1 and/or in other systems. As illustrated, digital power amplifier 140 includes first and second RF DACs 142, 144, a difference combiner 146, and a controller 148. As before, in some implementations, controller 148 may first determine an amplification mode that power amplifier 140 is to operate in. Controller 148 may then generate amplitude and phase related control signals for the first and second RF DACs 142, 144 based thereon.

In the embodiment illustrated in FIG. 5, first and second RF DACs 142, 144 are each switched capacitor DACs. These types of DACs typically include a plurality of capacitors that are all coupled to a common output node. More specifically, RF DAC 142 has capacitors 150 coupled to output node 152 and RF DAC 144 has capacitors 154 coupled to output node 156. As shown in FIG. 5, the capacitors within a particular RF DAC (e.g., RF DAC 142) may have different capacitance values from one another for use in achieving a desired output amplitude. For example, in a binary approach, the capacitance of each capacitor may different from an adjacent capacitor by a factor of 2. Each of the capacitors 150, 156 in first and second RF DACs 142, 144 may be driven by a corresponding inverter 158, 160 (or other alternative voltage source). As with the capacitance of the capacitors, the device width/strength of the inverters within each RF DAC may differ (e.g., the width of each inverter may be twice that of an adjacent inverter in some implementations). The bits of the digital control words $a_1<i>$, $a_2<j>$ may be applied to the inputs of the corresponding inverters 158, 160. Although not shown, digital power amplifier 140 may also include sampling clocks to provide clock signals to first and second RF DACs 142, 144, as described previously. Controller 148 may generate phase control information for delivery to the sample clocks. Operation of RF DACs similar to RF DACs 142, 144 of FIG. 5 is described in, for example, "A Switched Capacitor RF Power Amplifier," by Sang-Min Yoo et al., IEEE Journal of Solid-State Circuits, vol. 46, No. 12, December 2011. As described previously, any type of high speed DAC may be used in various embodiments. This may include, for example, voltage-mode DACs and current-mode DACs.

In the embodiment of FIG. 5, difference combiner 146 is a transformer combiner. The output of difference combiner 146 may be coupled to a load device 162. One or more capacitors 164 (and/or other circuit elements) may also be coupled to the output of combiner 146. In at least one implementation, the capacitor 164 may form a tank circuit with an output coil of transformer combiner 146 to provide a tuned output. The resonant frequency of the tank circuit may be expressed as:

$$f_{RF} = \frac{1}{2\pi\sqrt{LC}}$$

where C is the capacitance of capacitor 164 and L is the inductance of the output coil of combiner 143. As will be appreciated, other arrangements for providing a tuned output may be used in other implementations.

Figure 6:
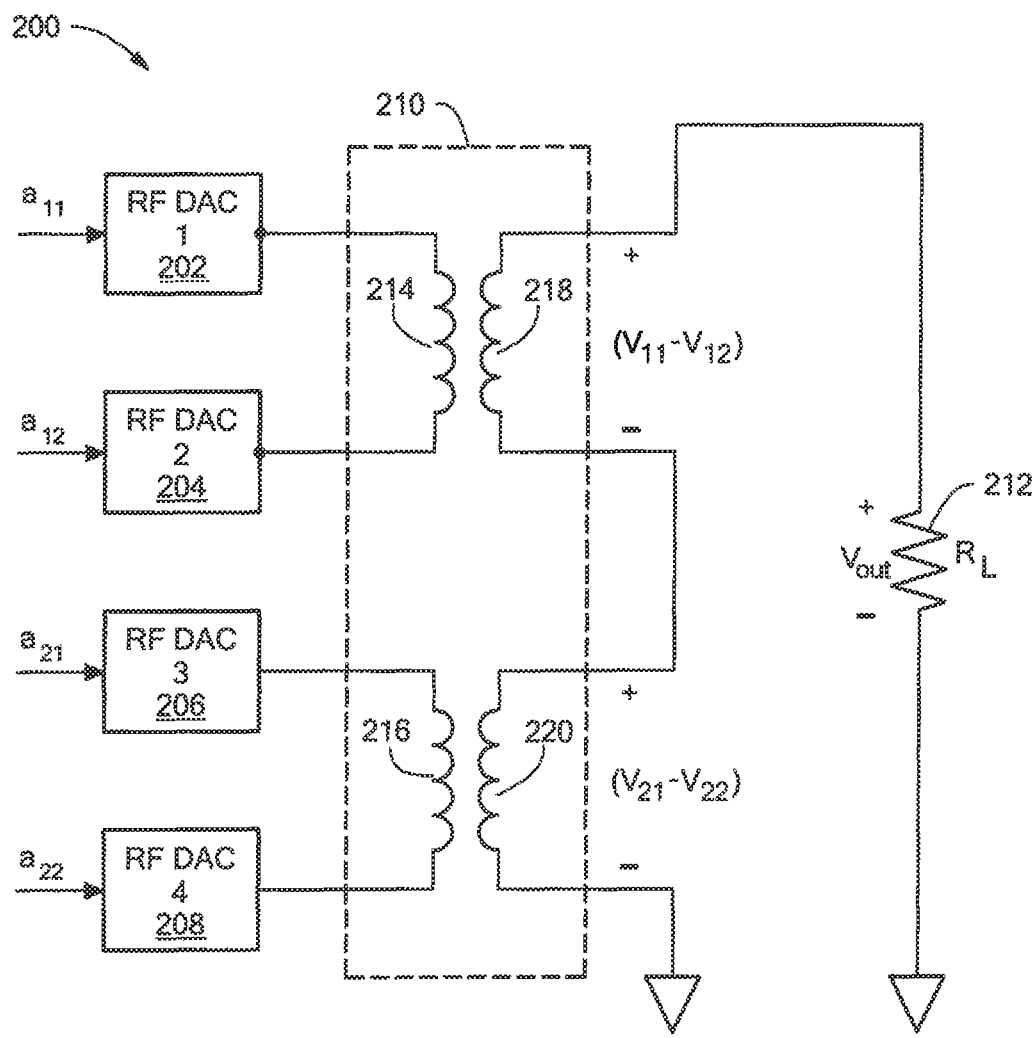
FIG. 6 is a schematic diagram illustrating an exemplary power amplification system that includes more than two RF DACs in accordance with an implementation.

In the embodiments described above, digital power amplification systems were described that use two RF DACs. It should be appreciated that power amplification systems using more than two RF DACs may also be implemented. For example, FIG. 6 is a schematic diagram illustrating an exemplary power amplification system 200 that includes four RF DACs in accordance with an embodiment. As shown, power amplification system 200 may include first, second, third, and fourth RF DACs 202, 204, 206, 208 and a combiner 210. The output of combiner 210 may be coupled to a load 212 (e.g., an antenna or other load device). Although not shown, first, second, third, and fourth RF DACs 202, 204, 206, 208 may have corresponding sampling clocks. A controller (not shown) may apply digital control words (e.g., $a_{11}$, $a_{12}$, $a_{21}$, $a_{22}$) to the inputs of the first, second, third, and fourth RF DACs 202, 204, 206, 208. Phase values may also be delivered to the corresponding sampling clocks.

Combiner 210 is a transformer combiner having first and second input coils 214, 216 and corresponding first and second output coils 218, 220. As shown, first and second RF DACs 202, 204 may be coupled to first input coil 214 and third and fourth RF DACs 206, 208 may be coupled to second input coil 216. The output voltage of combiner 210 is the sum of the voltages across first and second output coils 218, 220. As will be appreciated, power amplification system 200 represents one example of a power amplification system that uses more than two RF DAC. Other alternative architectures may be used in other embodiments.

Figure 7:
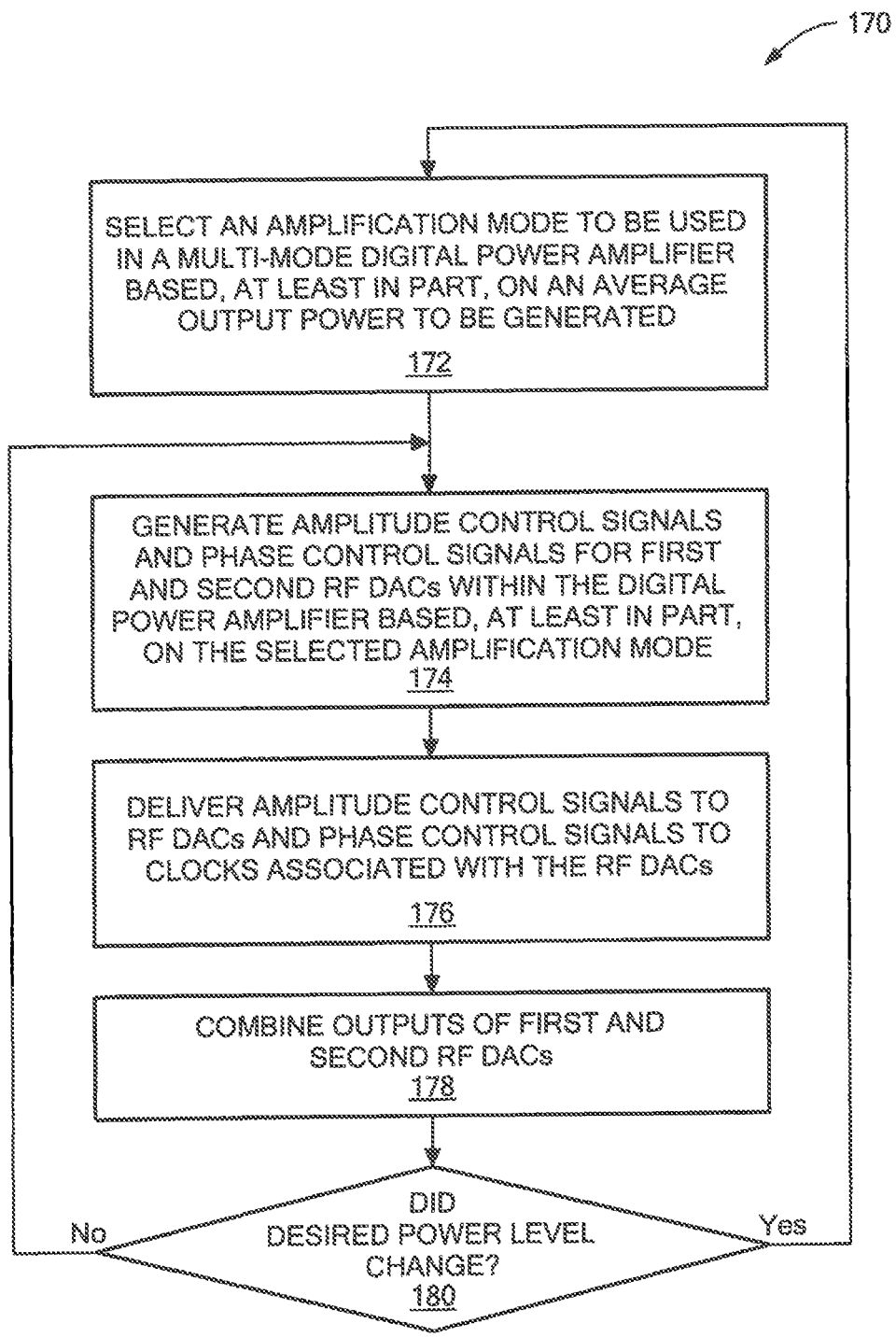
FIG. 7 is a flowchart illustrating an exemplary method for operating a multi-mode digital power amplifier in accordance with an implementation.

FIG. 7 is a flow diagram showing a process for operating a multi-mode digital power amplifier in accordance with an implementation.

The rectangular elements (typified by element 172 in FIG. 7) are herein denoted "processing blocks" and may represent computer software instructions or groups of instructions. It should be noted that the flow diagram of FIG. 7 represents one exemplary embodiment of a design described herein and variations in such a diagram, which generally follow the process outlined, are considered to be within the scope of the concepts, systems, and techniques described and claimed herein.

Alternatively, the processing blocks may represent operations performed by functionally equivalent circuits such as a digital signal processor circuit, an application specific integrated circuit (ASIC), or a field programmable gate array (FPGA). Some processing blocks may be manually performed while other processing blocks may be performed by a processor. The flow diagram does not depict the syntax of any particular programming language. Rather, the flow diagram illustrates the functional information one of ordinary skill in the art requires to fabricate circuits and/or to generate computer software to perform the processing required of the particular apparatus. It should be noted that many routine program elements, such as initialization of loops and variables and the use of temporary variables may not be shown. It will be appreciated by those of ordinary skill in the art that, unless otherwise indicated herein, the particular sequence described is illustrative only and can be varied without departing from the spirit of the concepts described and/or claimed herein. Thus, unless otherwise stated, the processes described below are unordered meaning that, when possible, the sequences shown in FIG. 7 can be performed in any convenient or desirable order.

Referring now to FIG. 7, an exemplary method 170 for operating a multi-mode digital power amplifier will be described. The method 170 is for use with a digital power amplifier having first and second RF DACs and corresponding sampling clocks with adjustable phases and a combiner to combine the outputs of the RF DACs, such as amplifier 12 of FIG. 1. Method 170 can be modified for use with amplifiers having more than 2 RF DACs. During operation of the digital power amplifier, the amplifier may called upon to generate different average power levels at different times. An amplification mode may be determined for use by the digital power amplifier based, at least in part, on the average output power level to be generated by the amplifier (block 172). The mode may be selected from a plurality of supported modes. These supported modes may include, for example, a polar mode, a linear amplification with non-linear components (LINC) mode, a multi-level LINC mode, an asymmetric multilevel outphasing (AMO) mode, and/or others.

After a mode has been selected, amplitude control signals and phase control signals may be generated for the first and second RF DACs in a manner that is designed to achieve the selected mode (block 174). As described above, the amplitude control signals and phase control signals may also depend upon the data to be amplified. The amplitude control signals may then be delivered to first and second RF DACs and the phase control signals may be delivered to clock generators associated with the first and second RF DACs. The RF output signals of the first and second RF DACs may then be combined in a combiner (block 178). It may then be determined whether or not a desired average output power level of the amplifier has changed (block 80). If the power level has not changed (block 180-N), method 170 may return to block 174 and generate amplitude control signals and phase control signals for the first and second RF DACs in a manner that is designed to achieve the previously selected mode. If the power level has changed (block 180-Y), method 170 may return to block 172 a new amplification mode may be selected based on the new desired power level. Amplitude control signals and phase control signals may then be generated for the first and second RF DACs in a manner that is designed to achieve the newly selected mode.

Figure 8:
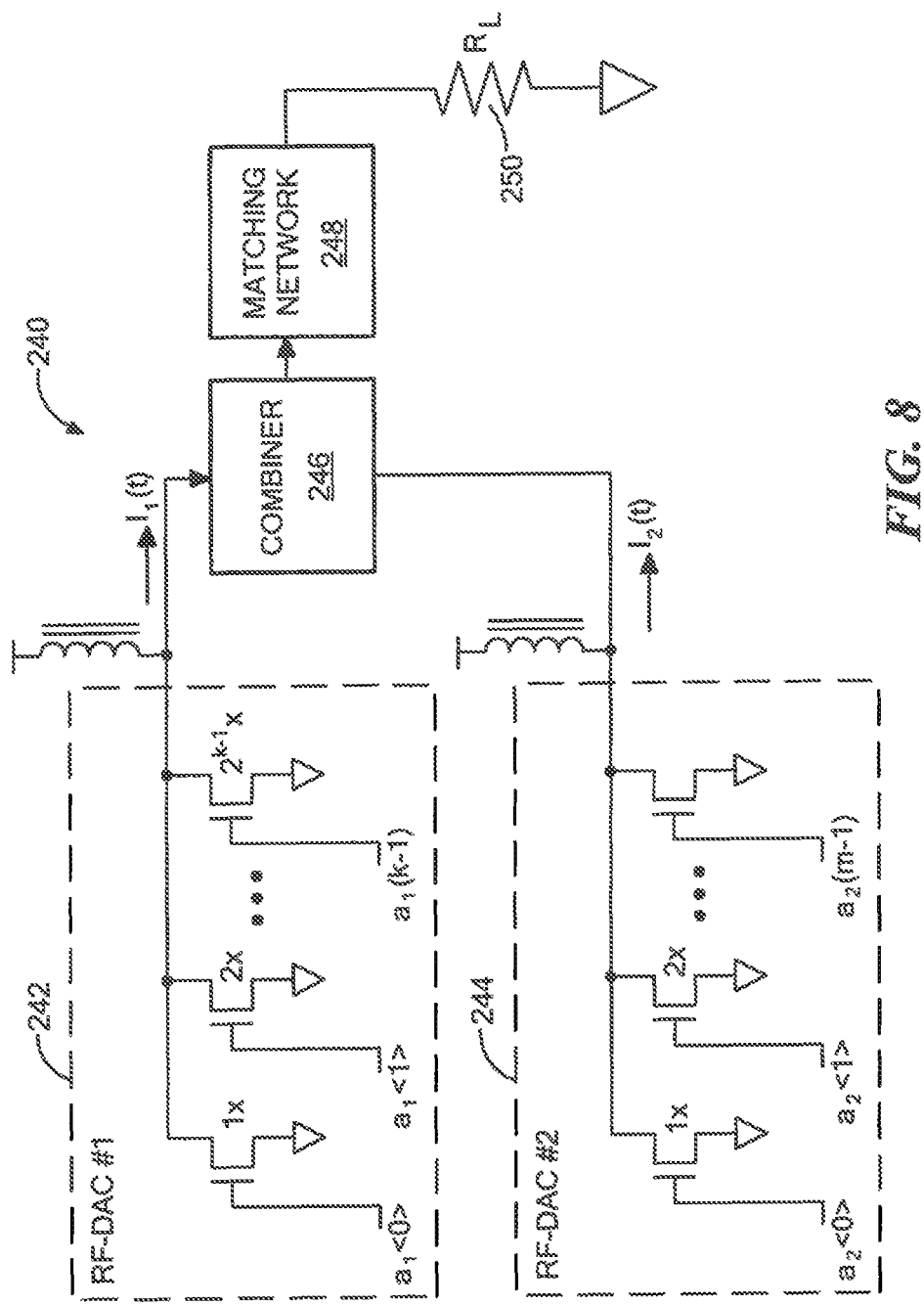
FIG. 8 is a schematic diagram illustrating an exemplary power amplification system that uses current mode RF DACs in accordance with an embodiment.

FIG. 8 is a schematic diagram illustrating an exemplary power amplification system 240 that uses current mode RF DACs in accordance with an embodiment. As illustrated, power amplification system 240 may include first and second current-mode RF DACs 242, 244; a combiner 246; a matching network 248; and a load device 250. First and second current-mode RF DACs 242, 244 may each generate a current signal at an output therefore that has a variable amplitude. In the illustrated embodiment, each current mode RF DAC 242, 244 include a series of parallel connected transistor devices having drain terminals coupled to a corresponding output node. Each transistor device may have a different size from the other transistor devices within the DAC. In one possible approach, for example, each transistor device within a DAC may be twice the size of an adjacent transistor device. The amplitude of the current signal output by each RF DAC 242, 244 will depend on a digital control word provided to inputs of the RF DAC at a particular point in time. Combiner 246 is operative for combining the current signals generated by each of the DACs 242, 244. Any type of device that is capable of combining two currents may be used as combiner 246. Optional matching network 248 may provide an impedance match between the power amplifier and load 250. In other embodiments, power amplification systems using more than two current mode RF DACs may be used.

In the discussion above, digital power amplifications devices and techniques are described in the context of a radio frequency (RF) transmitter. It should be appreciated, however, that these devices and techniques may also be used in components and systems that are not associated with an RF transmitter. In fact, the devices and techniques may be used in any application where high efficiency/high dynamic range power amplifiers are needed.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A digital radio frequency (RF) power amplifier comprising:
    a first radio-frequency digital to analog converter (RF-DAC) having a plurality of input terminals responsive to a first stream of digital data words representative of first amplitudes and an output terminal to output a first output signal having the first amplitudes;
    a first sampling clock to generate a clock signal for the first RF DAC, the first sampling clock having an adjustable phase and an input to receive a first phase control signal to set a phase of the first sampling clock;
    a second RF DAC having a plurality of input terminals responsive to a second stream of digital data words representative of second amplitudes and an output terminal to output a second output signal having the second amplitudes;
    a second sampling clock to generate a clock signal for the second RF DAC, the second sampling clock having an adjustable phase and an input to receive a second phase control signal to set a phase of the second sampling clock;
    a combiner to combine the first output signal and the second output signal; and
    a processor to generate the first stream of digital data words, the second stream of digital data words, the first phase control signal, and the second phase control signal, wherein the processor is configured to operate the digital RF power amplifier in one of multiple operating modes based, at least in part, on an output power level to be generated.

2. The RF power amplifier of claim 1, wherein:
    the multiple operating modes include at least a polar mode and a linear amplification with non-linear components (LINC) mode.

3. The RF power amplifier of claim 2, wherein:
    the processor is configured to operate the digital RF power amplifier in polar mode for higher output power levels and LINC mode for lower output power levels.

4. The RF power amplifier of claim 2, wherein:
    the multiple operating modes include at least a polar mode, a LINC mode, and a asymmetric multilevel outphasing (AMO) mode, wherein the processor is configured to operate the digital RF power amplifier in polar mode for higher output power levels, AMO mode for intermediate output power levels, and LINC mode for lower output power levels.

5. The RF power amplifier of claim 2, wherein:
    the processor is configured to operate the digital RF power amplifier in one of the multiple operating modes by appropriately generating the first stream of digital data words, the second stream of digital data words, the first phase control signal, and the second phase control signal.

6. The RF power amplifier of claim 1, wherein:
    the first RF DAC comprises a switched capacitor RF DAC.

7. The RF power amplifier of claim 6, wherein:
    the first RF DAC comprises a plurality of capacitors that are coupled to a common output node.

8. The RF power amplifier of claim 7, wherein:
    the first RF DAC further comprises a plurality of controllable voltage sources coupled to the plurality of capacitors to apply voltages to the plurality of capacitors in response to the first stream of digital data words.

9. The RF power amplifier of claim 1, wherein:
    the combiner is a difference combiner.

10. The RF power amplifier of claim 1, wherein:
the combiner is a transformer-based combiner.

11. The RF power amplifier of claim 1, wherein:
the first sampling clock has an adjustable clock frequency and an input to receive a first frequency control signal to set a frequency of the first sampling clock;
the second sampling clock has an adjustable clock frequency and an input to receive a second frequency control signal to set a frequency of the second sampling clock; and
the processor is configured to generate the first and second frequency control signals to control the frequency of the first and second sampling clocks based, at least in part, on a desired output frequency of the RF power amplifier.

12. The RF power amplifier of claim 1, further comprising:
a tunable output matching network to provide an impedance match between the RF power amplifier and a load device, the tunable output matching network having a tuning input for use in adjusting an operative frequency of the tunable output matching network.

13. The RF power amplifier of claim 1, further comprising:
at least one additional RF DAC; and
at least one additional sampling clock to generate a clock signal for the at least one additional RF DAC;
wherein the combiner is configured to combine the first output signal, the second output signal, and one or more output signals associated with the at least one additional RF DAC.

14. A method for use with a digital power amplifier having first and second radio frequency digital to analog converters (RF DACs) and a combiner to combine output signals of the first and second RF DACs, the method comprising:
selecting an amplification mode to be used in the digital power amplifier based, at least in part, on an average output power level to be generated; and
generating amplitude input signals and phase input signals for the first and second RF DACs based, at least in part, on the selected amplification mode;
wherein the digital power amplifier is capable of multiple different amplification modes, wherein the multiple different amplification modes includes a polar mode of operation.

15. The method of claim 14, wherein:
the multiple different amplification modes includes at least polar mode and a linear amplification with non-linear components (LINC) mode.

16. The method of claim 15, wherein:
selecting an amplification mode includes selecting polar mode for higher average output power levels and LINC mode for lower average output power levels.

17. The method of claim 14, wherein:
the multiple different amplification modes includes at least polar mode, LINC mode, and an asymmetric multilevel outphasing (AMO) mode.

18. The method of claim 17, wherein:
selecting an amplification mode includes selecting polar mode for higher average output power levels, AMO mode for intermediate average output power levels, and LINC mode for lower average output power levels.

19. The method of claim 14, further comprising:
monitoring an average output power level to be generated by the digital power amplifier; and
updating the amplification mode of the digital power amplifier based on the average output power level.

20. The method of claim 14, wherein:
generating phase input signals for the first and second RF DACs includes generating control signals for sampling clocks associated with the first and second RF DACs.

21. A non-transitory computer readable medium having instructions stored thereon that, when executed by a computer, perform a method for use with a digital power amplifier having first and second radio frequency digital to analog converters (RF DACs) and a combiner to combine output signals of the first and second RF DACs, the method comprising:
selecting an amplification mode to be used in the digital power amplifier based, at least in part, on an average output power level to be generated; and
generating amplitude input signals and phase input signals for the first and second RF DACs based, at least in part, on the selected amplification mode;
wherein the digital power amplifier is capable of multiple different amplification modes, the multiple different amplification modes including a polar mode.

22. The computer readable medium of claim 21, wherein:
the multiple different amplification modes include polar mode and a linear amplification with non-linear components (LINC) mode.

23. The computer readable medium of claim 22, wherein:
selecting an amplification mode includes selecting polar mode for higher average output power levels and LINC mode for lower average output power levels.

24. The computer readable medium of claim 21, wherein:
the multiple different amplification modes includes at least polar mode, a linear amplification with non-linear components (LINC) mode, and an asymmetric multilevel outphasing (AMO) mode.

25. The computer readable medium of claim 24, wherein:
selecting an amplification mode includes selecting polar mode for higher average output power levels, AMO mode for intermediate average output power levels, and LINC mode for lower average output power levels.

26. The computer readable medium of claim 21, wherein the method further comprises:
monitoring an average output power level to be generated by the digital power amplifier; and
updating the amplification mode of the digital power amplifier based on the average output power level.

* * * * *